United States Patent
Higuchi

(10) Patent No.: US 7,299,437 B2
(45) Date of Patent: Nov. 20, 2007

(54) METHOD AND APPARATUS FOR DETECTING TIMING EXCEPTION PATH AND COMPUTER PRODUCT

(75) Inventor: Hiroyuki Higuchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 319 days.

(21) Appl. No.: 11/063,773

(22) Filed: Feb. 24, 2005

(65) Prior Publication Data

US 2006/0123274 A1 Jun. 8, 2006

(30) Foreign Application Priority Data

Nov. 22, 2004 (JP) ............................. 2004-337832

(51) Int. Cl.
*G06F 17/50* (2006.01)
*G06F 11/00* (2006.01)
*G01R 31/28* (2006.01)
*G01R 31/08* (2006.01)
*G01R 31/02* (2006.01)

(52) U.S. Cl. .............................. 716/6; 703/16; 703/19; 714/33; 714/51; 714/55; 714/724; 714/741; 324/528; 324/532; 324/537; 702/59; 702/118; 702/125

(58) Field of Classification Search ................... 716/6; 703/16, 19; 714/33, 51, 55, 724, 741; 324/528, 324/532, 537; 702/59, 118, 125
See application file for complete search history.

(56) References Cited

U.S. PATENT DOCUMENTS

| | | | |
|---|---|---|---|
| 5,452,239 A * | 9/1995 | Dai et al. ..................... 703/19 |
| 5,544,175 A * | 8/1996 | Posse .......................... 714/736 |
| 5,633,812 A * | 5/1997 | Allen et al. ................... 703/15 |
| 6,289,473 B1* | 9/2001 | Takase ......................... 714/35 |
| 6,624,829 B1* | 9/2003 | Beck et al. .................. 715/771 |
| 6,813,739 B1* | 11/2004 | Grannis, III ................. 714/729 |
| 7,085,688 B1* | 8/2006 | Sumida et al. ................. 703/2 |
| 7,096,144 B1* | 8/2006 | Bateman ..................... 702/125 |
| 7,173,431 B1* | 2/2007 | Lo et al. ..................... 324/543 |
| 2004/0153897 A1* | 8/2004 | Ukon et al. ................. 714/701 |
| 2004/0260990 A1* | 12/2004 | Saxena et al. .............. 714/726 |
| 2006/0064616 A1* | 3/2006 | Rajski et al. ................ 714/726 |

FOREIGN PATENT DOCUMENTS

| JP | 2003-157297 | 5/2003 |
|---|---|---|
| JP | 2004-171149 | 6/2004 |

OTHER PUBLICATIONS

Marinescu et al., "High-Level Automatic Pipelining for Sequential Circuits", Proceedings of 14th International Symposium on Systems Synthesis, 2001, pp. 215-220.*

* cited by examiner

*Primary Examiner*—Phallaka Kik
(74) *Attorney, Agent, or Firm*—Staas & Halsey LLP

(57) ABSTRACT

A selector selects an FF pair (FFs, FFe) in circuit information, a calculator calculates value-capturing condition data at FFe, a divider divides a path set that matches the value-capturing condition data from a set of paths between the FF pair (FFs, FFe), and a multi-cycle path detector determines whether all the paths in the path set are multi-cycle paths. When the path set is a multi-cycle path, it is added to a timing exception path list that is output by an output unit.

12 Claims, 7 Drawing Sheets

METHOD AND APPARATUS FOR DETECTING TIMING EXCEPTION PATH AND COMPUTER PRODUCT

CROSS-REFERENCE TO RELATED APPLICATIONS

This application is based upon and claims the benefit of priority from the prior Japanese Patent Application No. 2004-337832, filed on Nov. 22, 2004, the entire contents of which are incorporated herein by reference.

BACKGROUND OF THE INVENTION

1) Field of the Invention

The present invention relates to a technology for timing analysis of a digital circuit, and more particularly to a technology for detecting a timing exception path.

2) Description of the Related Art

Timing analysis is an essential process in manufacturing a digital circuit for ensuring a proper operation of the digital circuit. In the timing analysis, a delay is estimated from a design of the digital circuit, and it is determined whether the delay is within a range that allows the digital circuit to operate normally. For the timing analysis, not only a netlist of the digital circuit to be designed, but also timing restriction information is necessary. The timing restriction information includes specifications for a clock, a mode, delay restriction, and a timing exception path, such as a multi-cycle path and a false path.

The netlist can be created, to some extent, automatically with a computer aided design system (CAD) tools such as logical synthesis tools and layout tools, the netlist of the digital circuit being designed can, to a certain extent. On the other hand, the timing restriction information is usually created manually. Since the amount information in the timing restriction information has not been very large, the timing restriction information has been manually generated without problems hitherto. However, recently, the timing restriction information is becoming more complex, and a speed and a scale of the digital circuit is increasing. As a result, it is becoming difficult to manufacture a digital circuit that operates according to a given clock cycle.

Accordingly, there is an increasing demand for a technology for efficiently detecting as many timing exception paths as possible. The timing exception paths include a path of which a delay of a path between arbitrary two sequential circuit elements in the digital circuit is not necessary to be confined to a single clock cycle, such as a multi-cycle path of which the delay may acceptably be two or more clock cycles, and a false path whose delay does not affect the delay of the entire circuit.

In a conventional technology for detecting such timing exception paths from a digital circuit, it is detected whether a path is a timing exception path for each of paths between sequential circuit elements. In another conventional technology, paths between sequential circuit elements are handled in a set, and such detection is performed for each of a combination of the sequential circuit elements in a unit of the combination. Such technologies are disclosed in, for example, Japanese Patent Application Laid-open Nos. 2003-157297 and 2004-171149.

In the conventional technology, in worst cases, an exponential explosion occurs on the path with respect to a circuit scale. Therefore, a calculation time for the detection greatly increases. In addition, when an amount of information on the timing exception path is large, calculation time of timing analysis tools that receive such information also increases.

On the other hand, in another one of the conventional technologies, it is possible to avoid such problems caused by increased number of paths. However, for example, when only some of the paths between arbitrary two sequential circuit elements are the timing exception paths, these timing exception paths cannot be detected.

The timing exception path includes the multi-cycle path and the false path, and analysis for the timing exception path is performed independently for each of the multi-cycle path and the false path. Such analysis is often redundant in terms of the analysis for the timing exception path as a whole, and this also leads to increase of the calculation time.

Recently, for manufacturing digital circuits, there is a demand to efficiently detect the timing exception paths during the circuit design stage with high accuracy, and to shorten a manufacturing period of digital circuits with increasingly complexity.

SUMMARY OF THE INVENTION

It is an object of the present invention to solve at least the above conventional problems.

An apparatus for detecting a timing exception path according to one aspect of the present invention includes a receiving unit that receives circuit information relating to a circuit in which a timing exception path is to be detected; a selecting unit that selects, from among a plurality of sequential circuit elements in the circuit information, a first sequential circuit element and a second sequential circuit element that receives a signal transmitted from the first sequential circuit element; a calculating unit that calculates value-capturing condition data relating to a multi-cycle in the second sequential circuit element; a dividing unit that divides, from among sets of paths between the first sequential circuit element and the second sequential circuit element, a set that matches the value-capturing condition data; and a detecting unit that detects whether all of the paths in the set divided are multi-cycle paths.

An apparatus for detecting a timing exception path according to another aspect of the present invention includes a receiving unit that receives circuit information relating to a circuit in which a timing exception path is to be detected; a selecting unit that selects, from among a plurality of sequential circuit elements in the circuit information, a first sequential circuit element and a second sequential circuit element that receives a signal transmitted from the first sequential circuit element; a calculating unit that calculates value-capturing condition data relating to a multi-cycle in the second sequential circuit element; a dividing unit that divides, from among sets of paths between the first sequential circuit element and the second sequential circuit element, a set that does not match the value-capturing condition data; and a detecting unit that detects whether each of the paths in the set divided is a false path.

An apparatus for detecting a timing exception path according to still another aspect of the present invention includes a receiving unit that receives circuit information relating to a circuit in which a timing exception path is to be detected; a selecting unit that selects, from among a plurality of sequential circuit elements in the circuit information, a first sequential circuit element and a second sequential circuit element that receives a signal transmitted from the first sequential circuit element; a calculating unit that calculates value-capturing condition data relating to a multi-cycle in the second sequential circuit element; a dividing unit that divides, from among sets of paths between the first sequential circuit element and the second sequential circuit element, a set that does not match the value-capturing condition data; and an extracting unit that extracts information relating to a path-selecting gate that arbitrarily selects a path from among the paths in the set divided; a setting unit that sets, based on the information relating to the path-selecting gate, information relating to a combination of values that are possible to be a value of a control signal for controlling the path-selecting gate; a judging unit that judges whether the combination of values is possible based on the information relating to the combination; and a determining unit that determines the path extracted is a false path based on a judgment made by the judging unit.

A method for detecting a timing exception path according to still another aspect of the present invention includes receiving circuit information relating to a circuit in which a timing exception path is to be detected; selecting, from among a plurality of sequential circuit elements in the circuit information, a first sequential circuit element and a second sequential circuit element that receives a signal transmitted from the first sequential circuit element; calculating value-capturing condition data relating to a multi-cycle in the second sequential circuit element; dividing, from among sets of paths between the first sequential circuit element and the second sequential circuit element, a set that matches the value-capturing condition data; and detecting whether all of the paths in the set divided are multi-cycle paths.

A method for detecting a timing exception path according to still another aspect of the present invention includes receiving circuit information relating to a circuit in which a timing exception path is to be detected; selecting, from among a plurality of sequential circuit elements in the circuit information, a first sequential circuit element and a second sequential circuit element that receives a signal transmitted from the first sequential circuit element; calculating value-capturing condition data relating to a multi-cycle in the second sequential circuit element; dividing, from among sets of paths between the first sequential circuit element and the second sequential circuit element, a set that does not match the value-capturing condition data; and detecting whether each of the paths in the set divided is a false path.

A method for detecting a timing exception path according to still another aspect of the present invention includes receiving circuit information relating to a circuit in which a timing exception path is to be detected; selecting, from among a plurality of sequential circuit elements in the circuit information, a first sequential circuit element and a second sequential circuit element that receives a signal transmitted from the first sequential circuit element; calculating value-capturing condition data relating to a multi-cycle in the second sequential circuit element; dividing, from among sets of paths between the first sequential circuit element and the second sequential circuit element, a set that does not match the value-capturing condition data; and extracting information relating to a path-selecting gate that arbitrarily selects a path from among the paths in the set divided; setting, based on the information relating to the path-selecting gate, information relating to a combination of values that are possible to be a value of a control signal for controlling the path-selecting gate; judging whether the combination of values is possible based on the information relating to the combination; and determining that the path extracted is a false path based on a judgment made at the judging.

A computer-readable recording medium according to still another aspect of the present invention stores a computer program for realizing the methods according to the above aspects. The other objects, features, and advantages of the present invention are specifically set forth in or will become apparent from the following detailed description of the invention when read in conjunction with the accompanying drawings.

DETAILED DESCRIPTION

Exemplary embodiments of the present invention will be explained below with reference to the accompanying drawings. A method and an apparatus for detecting a timing exception path, and a computer product according to embodiments described below are realized, for example, by a CAD with a recording medium in which a program for detecting a timing exception path is stored.

Figure 1:
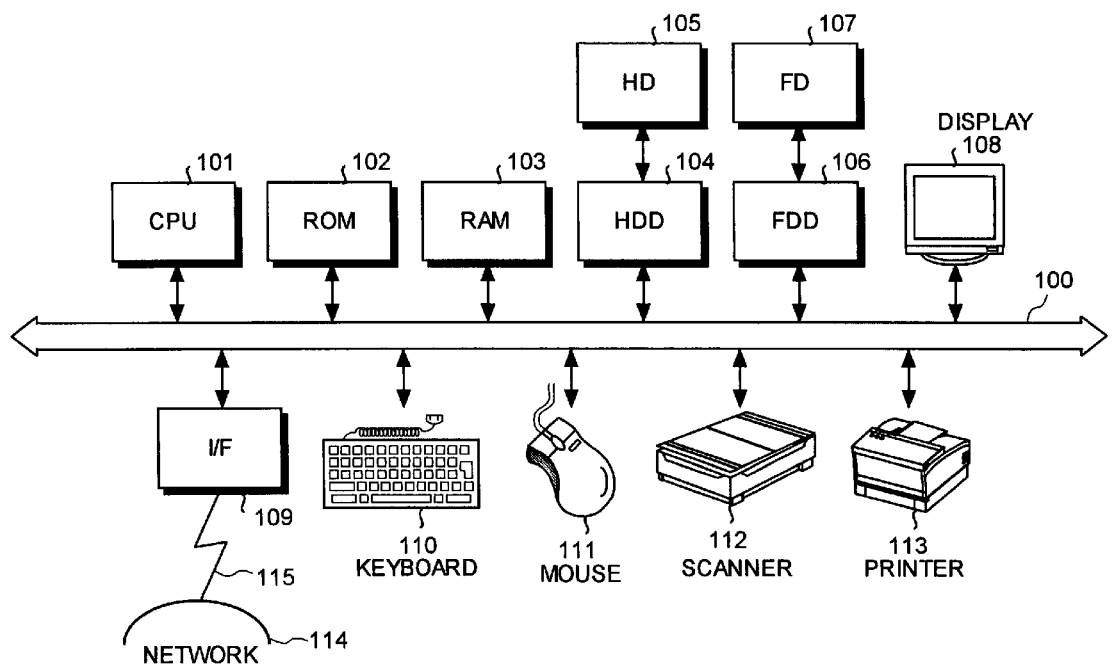
FIG. 1 is a schematic of an apparatus for detecting a timing exception path according to an embodiment of the present invention.

FIG. 1 is a schematic of an apparatus for detecting a timing exception path according to an embodiment of the present invention.

As shown in FIG. 1, the apparatus includes a central processing unit (CPU) 101, a read only memory (ROM) 102, a random access memory (RAM) 103, a hard disk drive (HDD) 104, a hard disk (HD) 105, a flexible disk drive (FDD) 106, a flexible disk (FD) 107 as one example of a removable recording medium, a display 108, an interface (I/F) 109, a keyboard 110, a mouse 111, a scanner 112, and a printer 113. The constituent elements are connected to each other through a bus 100.

The CPU 101 controls the apparatus. The ROM 102 stores programs such as a boot program. The RAM 103 is used as a work area of the CPU 101. The HDD 104 controls reading/writing of data from/to the HD 105 in accordance with a control of the CPU 101. The HD 105 stores data written by the HDD 104.

The FDD 106 controls reading/writing of data from/to the FD 107 in accordance with a control of the CPU 101. The FD 107 stores data written by the FDD 106, and allows the apparatus to read data that is stored on the FD 107.

Instead of the FD 107, the removable recording medium may be a CD-ROM (CD-R, CD-RW), a magneto-optical (MO), a digital versatile disk (DVD), a memory card, or the like. The display 108 displays data such as text, an image, and function information, as well as a cursor, an icon, or a tool box. For example, a cathode ray tube (CRT), a thin film transistor (TFT) liquid crystal display (LCD), a plasma display, or the like, can be used as the display 108.

The I/F 109 is connected via a communication line 115 to a network 114 such as the Internet, and via the network 114 to other devices. The I/F 109 operates the network 114 and an internal interface to control the input/out of data from external devices. A modem, a local area network (LAN) adaptor, or the like, can be used as the I/F 109.

The keyboard 110 includes keys for inputting text, numbers, various types of commands, and the like, and inputs data. Alternatively, it may include a touch panel input pad, a ten-key numerical pad, and the like. The mouse 111 is used for moving the cursor and selecting its range, or moving windows and changes their sizes, and the like. It may include a pointing device that performs similar functions, such as a track-ball and a joystick.

The scanner 112 optically reads images, and captures image data in the apparatus for detecting a timing exception path. The scanner 112 may have an optical character reader (OCR) function. The printer 113 prints images and textual data. For example, a laser printer or an ink-jet printer can be used.

Figure 2:
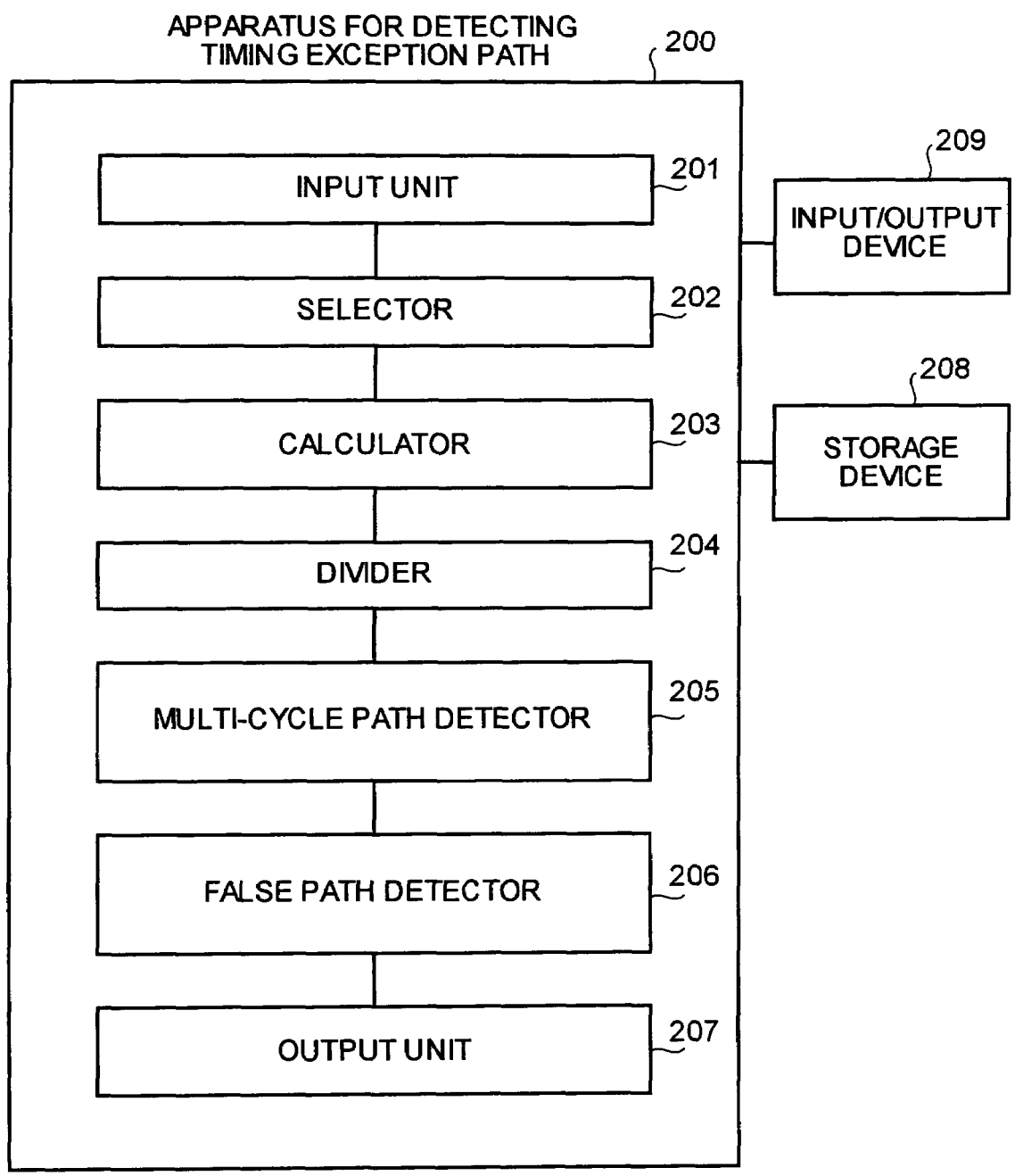
FIG. 2 is a functional block diagram of the apparatus shown in FIG. 1.

FIG. 2 is a functional block diagram of the apparatus. As shown in FIG. 2, an apparatus for detecting a timing exception path 200 includes an input unit 201, a selector 202, a calculator 203, a divider 204, a multi-cycle path detector 205, a false path detector 206, and an output unit 207, and the apparatus 200 is connected with a storage device 208 and an input/output device 209. The apparatus 200 executes detection processing for a timing exception path according to a program for detecting a timing exception path that is stored in the storage device 208.

The input unit 201 receives circuit information relating to a circuit in which a timing exception path is detected. The circuit is a digital circuit to be manufactured, and the circuit information relating thereto is a netlist that includes information relating to sequential circuit elements and information relating to connections between them. Specifically, the input unit 201 executes these functions using the I/F 109 shown in FIG. 1.

The selector 202 selects an arbitrary sequential circuit element (hereinafter, "first sequential circuit element"), and a second sequential circuit element that receives a signal that is transmitted from the first sequential circuit element, from among a plurality of the sequential circuit elements, for example, storage elements, in the circuit information. Specifically, the selector 202 realizes this function by making the CPU 101 execute a program stored in a recording medium such as the ROM 102, the RAM 103, the HD 105, or the FD 107, shown in FIG. 1.

The calculator 203 calculates value-capturing condition data that relates to a multi-cycle in the second sequential circuit element. The value-capturing condition data includes conditions for capturing values allocated in circuit information for the second sequential circuit element for capturing values during a multi-cycle. Specifically, the functions of the calculator 203 are realized by making the CPU 101 execute a program stored in a recording medium such as the ROM 102, the RAM 103, the HD 105, and the FD 107, shown in FIG. 1.

The divider 204 divides a set of paths that form a signal transmission paths between the first and the second sequential circuit elements into two kinds of path sets. The path sets includes a path set (hereinafter, "first path set") that matches the value-capturing condition data and a path set (hereinafter, "second path set") that does not match the value-capturing condition data. Specifically, for example, the divider 204 realizes such functions by making the CPU 101 execute a program stored in a recording medium such as the ROM 102, the RAM 103, the HD 105, and the FD 107, shown in FIG. 1. The multi-cycle path detector 205 detects whether all paths in the first path set are multi-cycle paths by performing path-based multi-cycle path analysis between the first and the second sequential circuit elements based on the value-capturing condition data. The multi-cycle path analysis uses a known multi-cycle path analysis method or the like. Specifically, for example, the multi-cycle path detector 205 realizes such functions by making the CPU 101 execute a program stored in a recording medium such as the ROM 102, the RAM 103, the HD 105, and the FD 107, shown in FIG. 1.

For example, the multi-cycle paths for one combination of the sequential circuit elements (A, B) can be detected by determining whether each combination of values that indicate changes of a value at a start-point (S) and an end-point (E) of the path between A and B, namely (S and E)=(0→1, 0→1); (0→1, 1→0); (1→0, 0→1); and (1→0, 1→0), is possible.

The false path detector 206 detects whether a path is a false path by performing false path analysis with respect to an entire set of the second path set, or to each of the paths in the second path set. Specifically, for example, the false path detector 206 realizes such functions by making the CPU 101 execute a program stored in a recording medium such as the ROM 102, the RAM 103, the HD 105, and the FD 107, shown in FIG. 1.

The output unit 207 outputs output information, for example, a timing exception path list, that relates to the circuit information, treating a path set of multi-cycle paths detected by the multi-cycle path detector 205, and a path sets of false paths detected by the false path detector 206 as the timing exception paths. Specifically, for example, the output unit 207 realizes such functions using the I/F 109 shown in FIG. 1.

The storage device 208 specifically includes the ROM 102, the RAM 103, the HDD 104, the HD 105, the FDD 106, and the FD 107 shown in FIG. 1. The input/output device 209 specifically includes the keyboard 110, the mouse 111, the scanner 112, and the printer 113 shown in FIG. 1.

Figure 3:
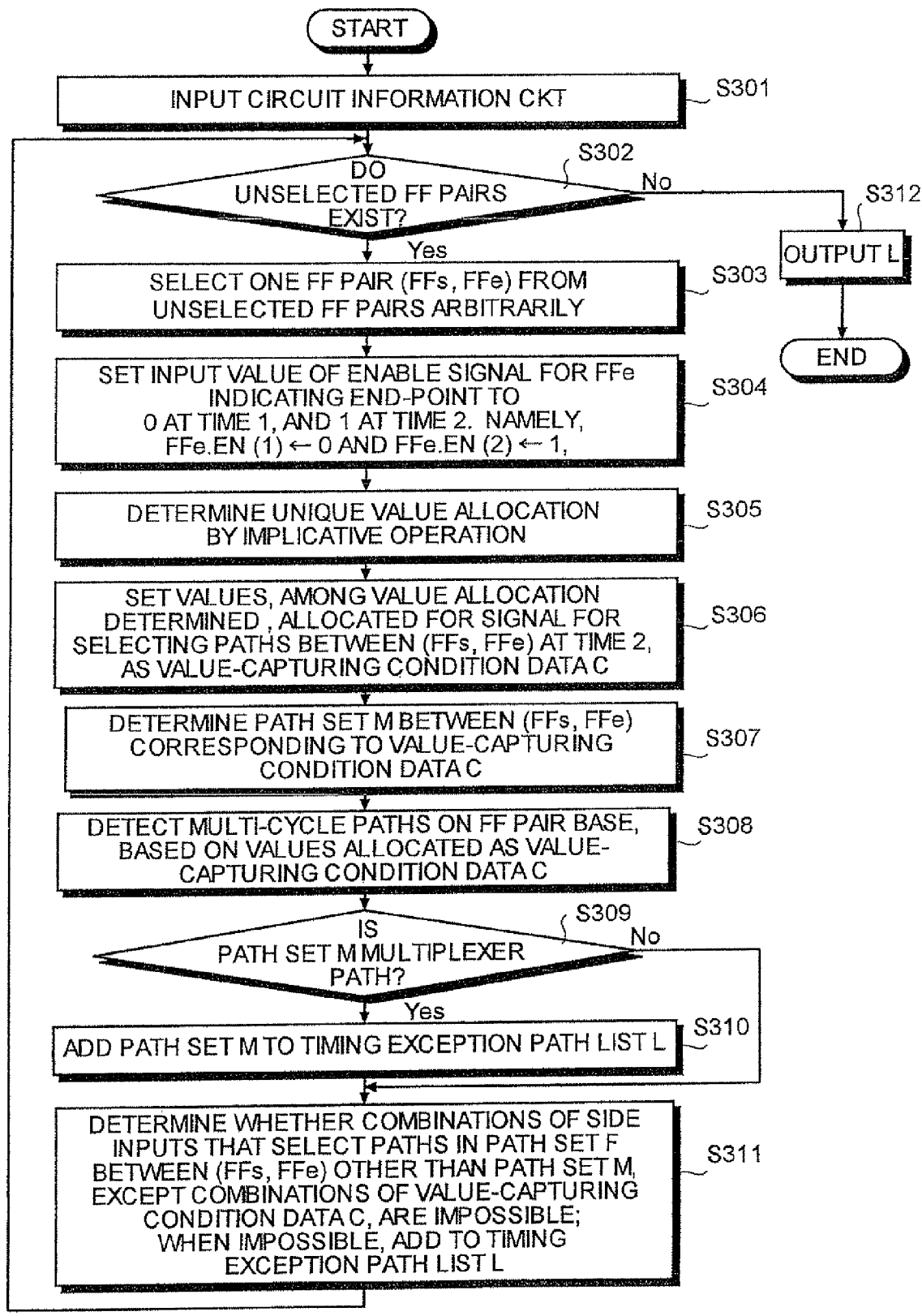
FIG. 3 is a flowchart of detection processing for a timing exception path according to an embodiment of the present invention.
Figure 4:
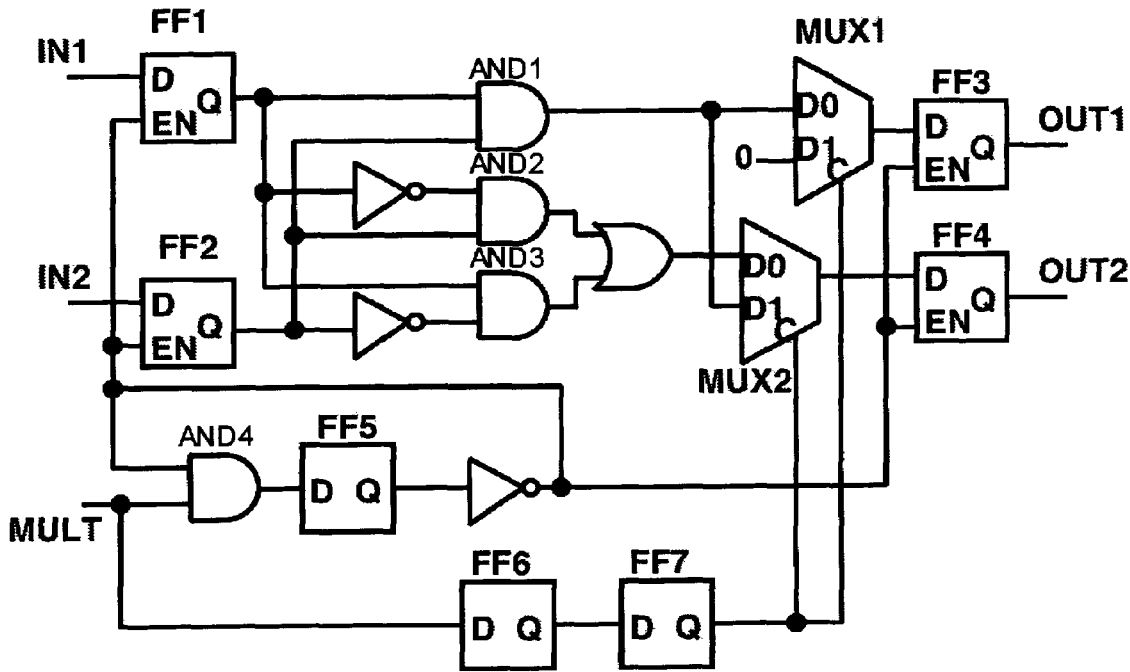
FIG. 4 is a circuit diagram for explaining the detection processing.
Figure 5:
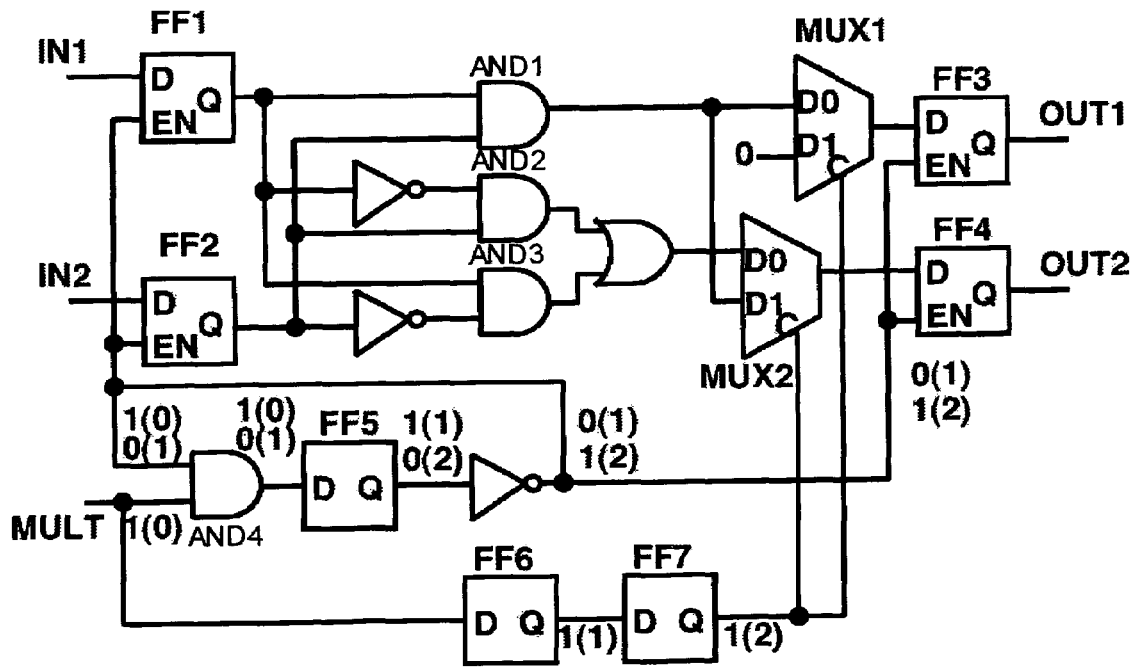
FIG. 5 is another circuit diagram for explaining the detection processing.

FIG. 3 is a flowchart of detection processing for a timing exception path according to an embodiment of the present invention. FIGS. 4 and 5 are circuit diagrams for explaining the detection processing. As shown in FIG. 3, the input/output device 209 sends circuit information CKT to the input unit 201 (step S301).

FIG. 4 is an example of a configuration of the circuit information CKT. In FIG. 4, flip-flops (FF) 1 to 7 that function as a plurality of storage elements, multiplexers (MUXs) 1 and 2 that function as path-selecting gates, a plurality of inverters (INVs), a plurality of AND gates 1 to 4, and one OR gate, are described as sequential circuit elements in the circuit information CKT, and are connected by signal lines as shown in FIG. 4.

The path in the sequential circuit in the circuit information CKT has an external input terminal or an output terminal of the FF as a start-point, then, input terminals of gates and output terminals of gates that are arranged alternately, and finally, an external output terminal or an input terminal of the FF as an end-point.

With respect to an a path P, signals that are input to the input terminals of the gates on the path P are termed on-input, while the others are termed side-input. The value of a gate input signal that uniquely determines an output signal from the output terminal of the gate is termed a control value, while values other than control values are termed non-control values. The value of the output signal of the gate output terminal, which is determined by the control value, is termed a controlled value. For example, the control value at the AND (OR) gate is 0 (1), the non-control value is 1 (0), and the controlled value is 0 (1).

When the circuit information CKT is input to the input unit 201 at step S301, it is determined whether there is any pair of FF (hereinafter, "FF pair"), from among FF pairs including one FF that is arbitrarily selected and another FF that receives a signal transmitted from the FF selected, that have not yet been selected by the selector 202 (step S302) based on the circuit information.

When it is determined that there are FF pairs that have not yet been selected ("YES" at step S302), the selector 202 arbitrarily selects one FF pair (FFs, FFe) from the FF pairs that have not been selected (step S303). On the other hand, when it is determined that there are no FF pairs that have not been selected ("NO" at step S302), the output unit 207 outputs a timing exception path list L to the input/output device 209 (step S312), and the detection processing ends.

When the selector 202 selects the FF pair (FFs, FFe), the input value of an enable signal to the enable terminal of FFe is set to 0 at time 1, and 1 at time 2, so that the calculator 203 can calculate the value-capturing condition data for capturing values in a multi-cycle at FFe, which is at the end-point of the path of the selected FF pair (FFs and FFe) (step S304). The settings are FFe.En (1)←0 and FFe.EN (2)←1, so that, while no value is captured in the multi-cycle at time 2, a value is captured in the multi-cycle at time 3.

The calculator 203 performs an implicative operation to determine allocation of values in the circuit information CKT, which is uniquely determined, from the input value of the enable signal set at step S304 (step S305). The implicative operation is an operation of allocating as many signal values as possible in the circuit information CKT, which is uniquely determined, by transmitting allocated values. A contradiction that arises in the value allocation during the implicative operation indicates that the combination of values that are allocated before the implicative operation is actually impossible. For this combination, there is no need to determine whether there is a multi-cycle.

Among the value allocations determined by the implicative operation of step S305, the calculator 203 sets value allocation that is a signal for selecting the path between the FF pair (FFs, FFe) at time 2 as the value-capturing condition data C of FFe (step S306). In the circuit information CKT, a control signal for selecting a path in a predetermined path set is an input signal having a function of selecting whether the D0 input terminal and the D1 input terminal of the MUX 1 and 2 will both be input terminals for control signals that a path in the path set will pass, or control signals of which significance is equivalent to this, and for selecting a path in the predetermined path set when the value of the signal is 1, and selects another path when the value of the signal is 0.

The value-capturing condition data C that relates only to the selection of a path between the FF pair (FFs, FFe) is set at step S306. Based on the value-capturing condition data C, the divider 204 divides the path set that includes a plurality of paths between the FF pair (FFs, FFe) into a path set M as the first path set, which matches the value-capturing condition data C, and a path set F as the second path set, which does not match the value-capturing condition data C. Among the path sets M and F, the divider 204 determines the path set M (step S307).

The multi-cycle path detector 205 performs FF pair-based multi-cycle path detection with respect to the in the path set M based on the value allocation for the value-capturing condition data C determined at step S306 (step S308). The multi-cycle path is a path in which a signal passing along an arbitrary path P is not necessary to travel from the start-point to the end-point in a single clock.

The multi-cycle paths are detected at step S308 after appending the value-capturing condition data C to the detection of multi-cycle paths on the FF pair base. Therefore, even when only some of the paths in the path set between the FF pair (FFs, FFe) are multi-cycle paths, these multi-cycle paths can be detected.

When it has been determined that the path set M is a multi-cycle path ("YES" at step S309), the output unit 207 adds the path set M to the timing exception path list L (step S310). On the other hand, when it has been determined that the path set M is not a multi-cycle path ("NO" at step S309), processing shifts to a subsequent step S311.

With respect to the path set F, other than the path set M, the false path detector 206 determines whether the path set F expressed by each combination of the side inputs to the input terminals of all gates for selecting paths in the path set F, except combinations of the value-capturing condition data C, is a false path based on the possibility of that combination occurring, and determines the path set F to be a false path when its occurrence is impossible, the output unit 207 adds it to the timing exception path list L (step S311). The false path is one that does not affect the delay of the circuit. When the false path detector 206 completes the processing of step S311, the sequence returns to step S302, and the steps from S302 to S311 are repeated.

Figure 6:
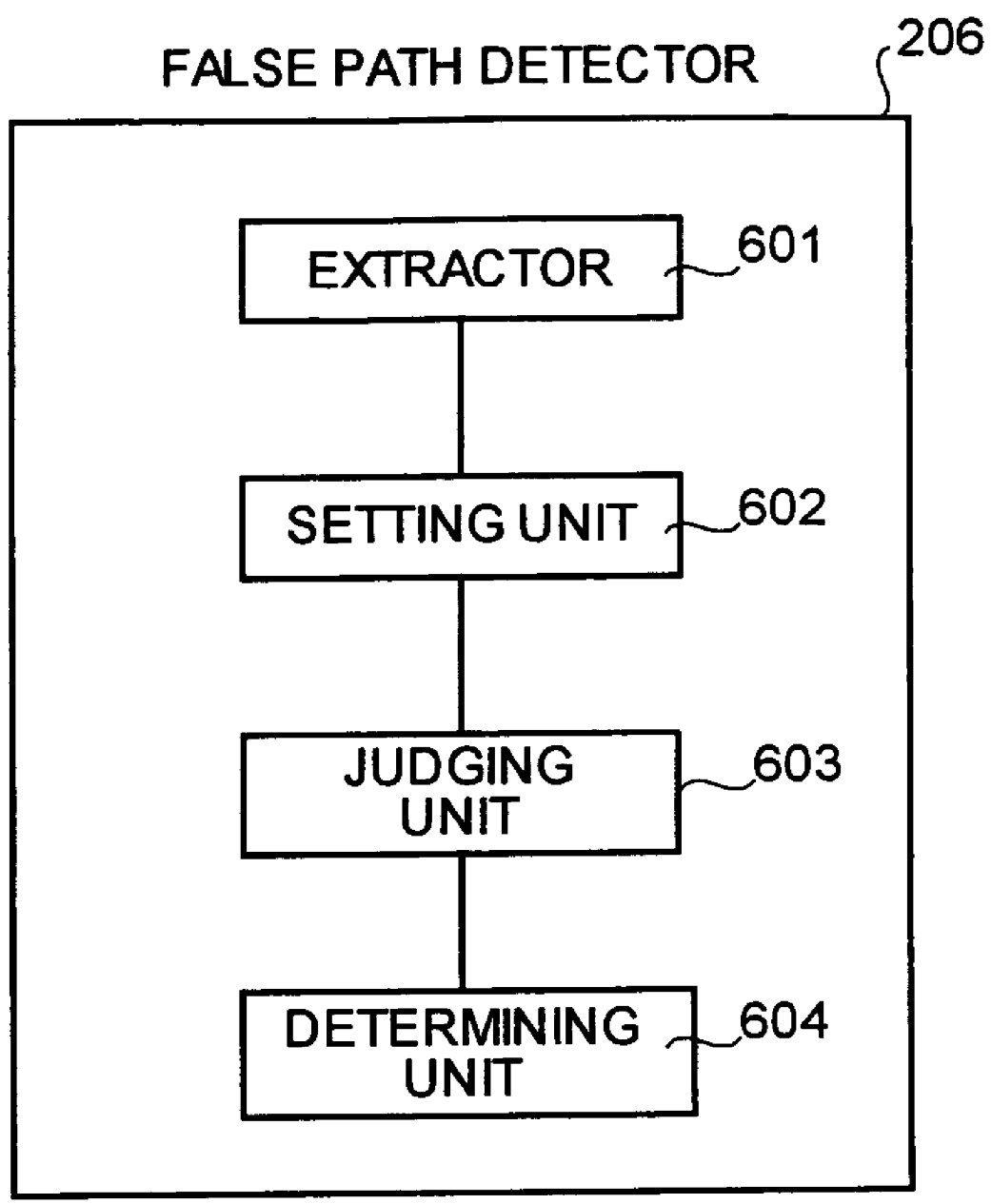
FIG. 6 is a block diagram of a false path detector that is used in the detection processing.
Figure 7:
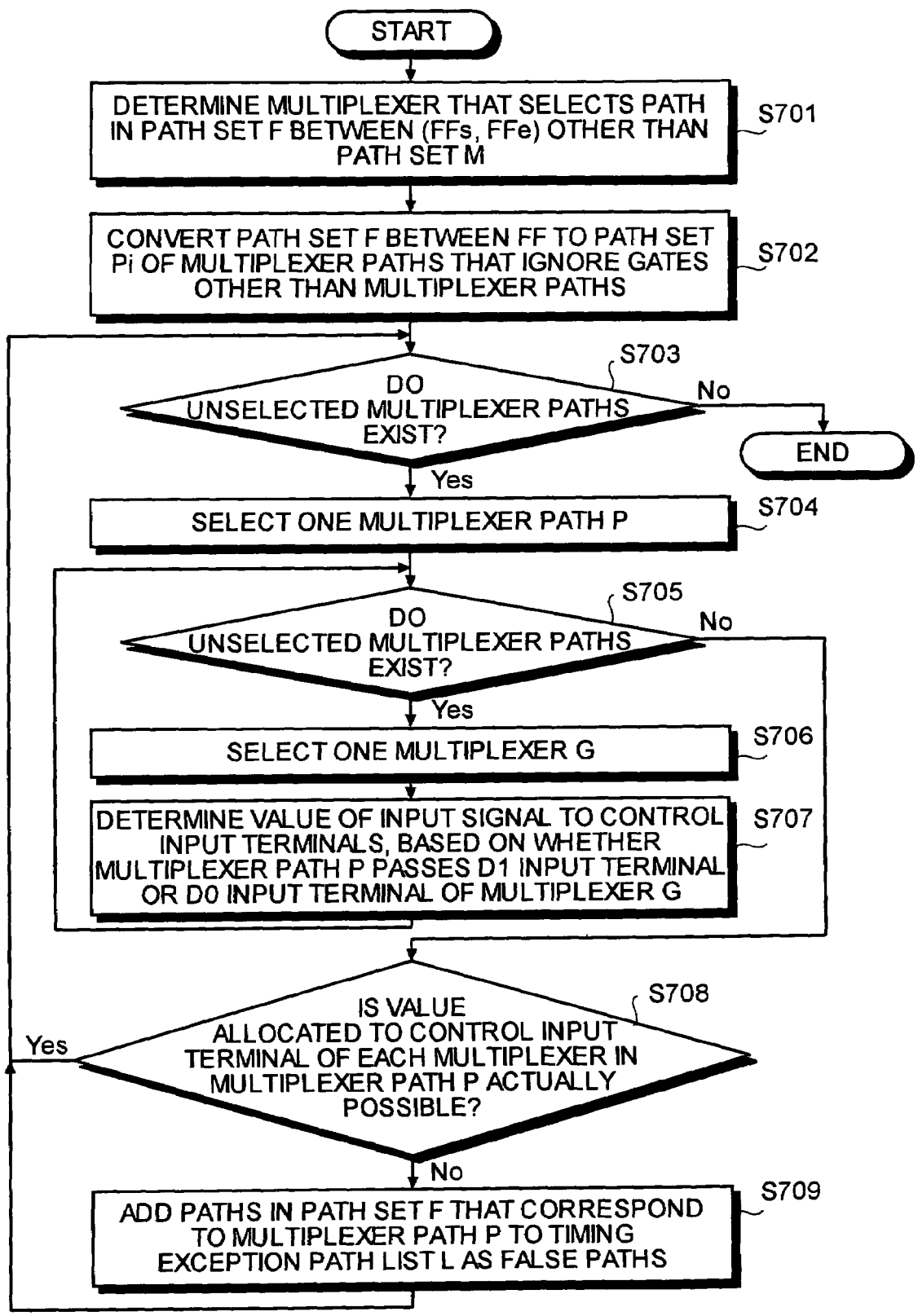
FIG. 7 is a flowchart of false path detection processing by the false path detector.

FIG. 6 is a block diagram of a false path detector that is used in the detection processing. FIG. 7 is a flowchart of false path detection processing by the false path detector.

The false path detector 206 includes an extractor 601, a setting unit 602, a judging unit 603, and a determining unit 604 as shown in FIG. 6. Specifically, for example, functions of the extractor 601, the setting unit 602, the judging unit 603, and the determining unit 604, of the false path detector 206 are realized by making the CPU 101 execute programs that are stored in recording media, such as the ROM 102, the RAM 103, the HD 105, and the FD 107, shown in FIG. 1.

The extractor 601 extracts information relating to path-selecting gates (for example, MUX 1 and 2, see FIGS. 4 and 5) that select an arbitrary path P in the path set F. Based on the information relating to the path-selecting gates extracted by the extractor 601, the setting unit 602 sets information relating to combinations of obtainable values for control signals that control the path-selecting gates. The obtainable value for a control signal is a control value that can be obtained for a signal input as a control signal to the control input terminal of a path-selecting gate.

Based on the information relating to combinations of obtainable values, set by the setting unit 602, the judging unit 603 determines whether this combination of values is possible. Based on the determination, the determining unit 604 determines the path P in the path set F to be a false path.

As shown in FIG. 7, a path-selecting gate, for example, an MUX, which selects a path in the path set F between the FF pair (FFs, FFe) other than the path set M is determined (step S701).

Based on the MUX determined at step S701, the path set F between the FF pair (FFs, FFe) is converted into a path set Pi of MUX paths that ignore gates (for example, AND (OR) gates) other than MUX (step S702). Converting the path set F into the path set Pi extracts only the MUX from the path set F, thereby generating the path set Pi of the MUX paths.

After the path set Pi has been determined at step S702, the false path detector 206 detects whether any unselected MUX paths remain in the path set Pi (step S703). When it is determined that there are unselected MUX paths ("YES" at step S703), an arbitrary MUX path P is selected from the path set Pi (step S704). On the other hand, when it is determined that there are no unselected MUX paths ("NO"

at step S703), the processing of step S311 in the flowchart of FIG. 3 ends, and the processing from step S302 to S311 is repeated.

When the MUX path P is selected at step S704, it is determined whether there are any MUX that has not been selected in the MUX path P selected (step S705). When it is determined that there are MUX that have not been selected ("YES" at step S705), the extractor 601 of the false path detector 206 selects an arbitrary MUXG from the MUX that have not been selected (step S706).

When the extractor 601 extracts the MUXG, the setting unit 602 sets the value (control value) of the input signal to the control input terminals that controls the extracted MUXG, depending on whether the MUX path P passes the D1 input terminal or the D0 input terminal of the MUXG (step S707). Processing then returns to step S705, at which it is determined whether any MUX that has not been selected remains.

On the other hand, when it is determined that there are no unselected MUX ("NO" at step S705), processing shifts to step S807 for determination by the judging unit 603. Based on the control value set by the setting unit 602, the judging unit 603 determines whether the value that is allocated as an input signal to the control input terminals of each MUX in MUX path P is actually possible (step S708).

When it is determined that the allocated value is possible ("YES" at step S708), the sequence returns to step S703, and the processing from step S703 to step S708 is repeated. When it is determined that the allocated value is not possible ("NO" at step S708), the determining unit 604 adds the paths in the path set F corresponding to the MUX path P to the timing exception path list L as false paths, based on the determination made by the judging unit 603 (step S709). When the processing at step S709 ends, the sequence returns to step S703 and the processing from step S703 to step S709 is repeated.

The circuit shown in FIG. 4 performs addition (ADD) processing in one clock cycle when the value of the input signal to the MULT input terminal of the circuit is MULT= (0), and performs multiplication (MULT) processing in two clock cycles when MULT=(1).

At step S301 shown in FIG. 3, it is assumed that the circuit information CKT of the circuit shown in FIG. 4 is input by the input unit 201. It is also assumed that FF1 and FF4 are selected as the FF pair (FFs, FFe) at step S303. When the selector 202 selects the FF pair (FF1, FF4), the calculator 203 sets the input values of an enable signal sent to the enable terminal of the FFe for calculating the value-capturing condition data to FF4. EN(1)←0, FF4. EN(2)←1 at step S304.

When the calculator 203 sets the input value of the enable signal to the enable terminal of FF4, an implicative operation of allocating values is performed at step S305. The circuit shown in FIG. 5 reflects the result of this implicative operation in the circuit shown in FIG. 4. In FIG. 5, the numerical values on each signal line represent values allocated to them, and the numerical values in brackets represent the time. For example, the numerical values "1 (2)" near the Q output terminal of FF7 indicate that the output signal from the Q output terminal of FF7 is 1 (FF7. Q=1) at time 2.

After the calculator 203 performs an implicative operation of allocating values for each signal line, the value allocation for the signal that selects a path between the FF pair (FF1, FF4) is set as the value-capturing condition data C in a subsequent step S306. In the circuit shown in FIG. 5, the input signal to the input terminal of the MUX 2 selector (hereinafter, "C") is the signal that selects the path from FF1 to FF4. Consequently, a condition of MUX.2 C(2)=1 is set as the value-capturing condition data C that captures the value in a multi-cycle at FF4. The set value-capturing condition data C of MUX. 2 C(2)=1 indicates that multiplication conditions for calculating MULT have been set correctly, since the value of the signal input to the MULT input terminal of the circuit corresponds to MULT(0)=1.

The value-capturing condition data C (MUX. 2 C(2)=1) indicates that the input signal to the D1 input terminal of MUX 2 is selected. Therefore, at step S307, the divider 204 divides the path set between the FF pair (FF1 and FF4) into a path set M of paths that include the D1 input terminal of MUX 2 as a pass point, and a path set F of paths that include the D0 input terminal of MUX 2 as a pass point, based on the value-capturing condition data C.

Having allocated the value-capturing condition data C (MUX. 2 C(2)=1), at step S308, the multi-cycle path detector 205 detect multi-cycle paths in the path set M divided by the divider 204. Since the path set M between the FF pair (FF1, FF4) matches the value-capturing condition data C (MUX. 2 C(2)=1), the fact that all the paths in the path set M are multi-cycle paths is detected at step S309. It can thereby be confirmed that the paths between the FF pair- (FF1, FF4) that pass the D1 input terminal of MUX 2 are multi-cycle paths.

At step S311, the false path detector 206 detects false paths in the path set F, divided from the FF pair (FF1, FF4) at step S307. The path set F passes through the D0 input terminal of the MUX 2, and, includes paths that pass through the AND gate 2 and paths that pass through the AND gate 3 in the circuit shown in FIG. 5. In the circuit shown in FIG. 5, since the paths that pass through the AND gates 1 and 2 include no MUX 1 and 2 having the condition of passing both D1 and D2 input terminals, the false path detector 206 determines that they are not false paths, and does not add them to the timing exception path list L.

Figure 8:
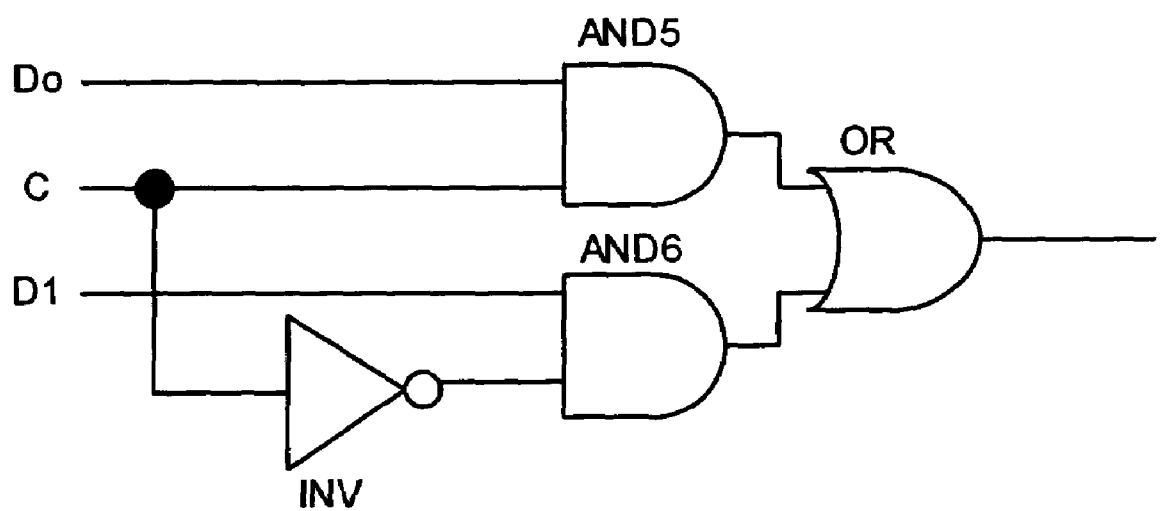
FIG. 8 is a circuit diagram of another path-selecting gate in circuit information used in the detection processing.

FIG. 8 is a circuit diagram of another path-selecting gate in the circuit information that is used in detection processing. While the embodiment described above uses a MUX as the path-selecting gate, one acceptable alternative is a path-selecting gate that includes two AND gates 5 and 6, one INV, and one OR gate, as in the example shown in FIG. 8.

As described above, in the method and the apparatus for detecting a timing exception path, the computer product according to the embodiments of the present invention, a path set that matches the value-capturing condition data relating to a multi-cycle from a set of paths between sequential circuit elements in the circuit being detected is divided, and it is detected whether each of all the paths in the path set divided is a multi-cycle path. Thus, the multi-cycle paths can be efficiently detected even when not all the paths between the sequential circuit elements are multi-cycle paths. Increase of the calculation time can be prevented, since the paths between the sequential circuit elements are detected in a set.

Furthermore, in the method and the apparatus for detecting a timing exception path, and the computer product according to the embodiments of the present invention, a path set that does not match the value-capturing condition data relating to a multi-cycle from a set of paths between sequential circuit elements in the circuit being detected is divided, and it is detected whether each of the paths in the set divided is a false path. Thus, it is possible to efficiently detect paths between the sequential circuit elements in a set, and detect false paths in a set of paths that do not capture values in a multi-cycle between the sequential circuit elements with high accuracy, thereby preventing increase of the calculation time.

Moreover, in the method and the apparatus for detecting a timing exception path, and the computer product according to the embodiments of the present invention, a path set that does not match the value-capturing condition data relating to a multi-cycle from a set of paths between sequential circuit elements in the circuit being detected is divided. Information relating to path-selecting gates in the path set divided is extracted, and information that relates to a combination of possible values for control signals that control the path-selecting gates based on the information relating to them is set. It is determined whether the combination of values is possible based on the information that relate to the combination of set values, and the paths in the path set to be false paths are determined based on the result of the determination. Thus, it is possible to efficiently detect paths between the sequential circuit elements in a set, and detect a set of false paths in a set of paths that do not capture values in a multi-cycle between the sequential circuit elements with high accuracy, thereby preventing increase of the calculation time.

As described above, according to the method and the apparatus for detecting a timing exception path, and the computer product according to the embodiments of the present invention, it is possible to detect timing exception paths between sequential circuit elements efficiently and with high accuracy, and shorten designing time.

The method for detecting a timing exception path described in the above embodiment can be realized by making a computer such as a personal computer, a work station, and a CAD, execute a program that is prepared beforehand. The program is stored in a computer-readable recording medium, such as a hard disk, a flexible disk, a CD-ROM, an MO, a DVD, and the like, and is executed by being read from the recording medium by the computer. The program may be a transmission medium that can be distributed via a network such as the Internet.

According to the present invention, it is possible to detect timing exception paths between sequential circuit elements efficiently and with high accuracy, and shorten designing time.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An apparatus for detecting a timing exception path, comprising:
   a receiving unit that receives circuit information relating to a circuit in which a timing exception path is to be detected;
   a selecting unit that selects, from among a plurality of sequential circuit elements in the circuit information, a first sequential circuit element and a second sequential circuit element that receives a signal transmitted from the first sequential circuit element;
   a calculating unit that calculates value-capturing condition data relating to a multi-cycle in the second sequential circuit element;
   a dividing unit that divides, from among sets of paths between the first sequential circuit element and the second sequential circuit element, a set that matches the value-capturing condition data;
   a detecting unit that detects whether all of the paths in the set divided are multi-cycle paths; and
   an output unit outputting results of the detecting unit.

2. The apparatus according to claim 1, wherein the dividing unit further divides a set that does not match the value-capturing condition data from among the sets.

3. The apparatus according to claim 2, wherein the detecting unit detects whether each of the paths in the set divided by the dividing unit, that does not match the value-capturing condition data is a false path.

4. The apparatus for detecting a timing exception path according to claim 1, further comprising:
   an extracting unit that extracts information relating to a path-selecting gate that arbitrarily selects a path from among the paths in the set divided;
   a setting unit that sets, based on the information relating to the path-selecting gate, information relating to a combination of values that are possible to be a value of a control signal for controlling the path-selecting gate;
   a judging unit that judges whether the combination of values is possible based on the information relating to the combination; and
   a determining unit that determines the path extracted is a false path based on a judgment made by the judging unit.

5. An apparatus for detecting a timing exception path, comprising:
   a receiving unit that receives circuit information relating to a circuit in which a timing exception path is to be detected;
   a selecting unit that selects, from among a plurality of sequential circuit elements in the circuit information, a first sequential circuit element and a second sequential circuit element that receives a signal transmitted from the first sequential circuit element;
   a calculating unit that calculates value-capturing condition data relating to a multi-cycle in the second sequential circuit element;
   a dividing unit that divides, from among sets of paths between the first sequential circuit element and the second sequential circuit element, a set that does not match the value-capturing condition data;
   a detecting unit that detects whether each of the paths in the set divided is a false path; and
   an output unit outputting results of the detecting unit.

6. An apparatus for detecting a timing exception path, comprising:
   a receiving unit that receives circuit information relating to a circuit in which a timing exception path is to be detected;
   a selecting unit that selects, from among a plurality of sequential circuit elements in the circuit information, a first sequential circuit element and a second sequential circuit element that receives a signal transmitted from the first sequential circuit element;
   a calculating unit that calculates value-capturing condition data relating to a multi-cycle in the second sequential circuit element;
   a dividing unit that divides, from among sets of paths between the first sequential circuit element and the second sequential circuit element, a set that does not match the value-capturing condition data; and
   an extracting unit that extracts information relating to a path-selecting gate that arbitrarily selects a path from among the paths in the set divided;
   a setting unit that sets, based on the information relating to the path-selecting gate, information relating to a combination of values that are possible to be a value of a control signal for controlling the path-selecting gate;
   a judging unit that judges whether the combination of values is possible based on the information relating to the combination;
   a determining unit that determines the path extracted is a false path based on a judgment made by the judging unit; and
   an output unit outputting results of the determining unit.

7. A method for detecting a timing exception path, comprising:
- receiving circuit information relating to a circuit in which a timing exception path is to be detected;
- selecting, from among a plurality of sequential circuit elements in the circuit information, a first sequential circuit element and a second sequential circuit element that receives a signal transmitted from the first sequential circuit element;
- calculating value-capturing condition data relating to a multi-cycle in the second sequential circuit element;
- dividing, from among sets of paths between the first sequential circuit element and the second sequential circuit element, a set that matches the value-capturing condition data;
- detecting whether all of the paths in the set divided are multi-cycle paths; and
- outputting results of the detecting.

8. A method for detecting a timing exception path, comprising:
- receiving circuit information relating to a circuit in which a timing exception path is to be detected;
- selecting, from among a plurality of sequential circuit elements in the circuit information, a first sequential circuit element and a second sequential circuit element that receives a signal transmitted from the first sequential circuit element;
- calculating value-capturing condition data relating to a multi-cycle in the second sequential circuit element;
- dividing, from among sets of paths between the first sequential circuit element and the second sequential circuit element, a set that does not match the value-capturing condition data;
- detecting whether each of the paths in the set divided is a false path; and
- outputting results of the detecting.

9. A method for detecting a timing exception path, comprising:
- receiving circuit information relating to a circuit in which a timing exception path is to be detected;
- selecting, from among a plurality of sequential circuit elements in the circuit information, a first sequential circuit element and a second sequential circuit element that receives a signal transmitted from the first sequential circuit element;
- calculating value-capturing condition data relating to a multi-cycle in the second sequential circuit element;
- dividing, from among sets of paths between the first sequential circuit element and the second sequential circuit element, a set that does not match the value-capturing condition data; and
- extracting information relating to a path-selecting gate that arbitrarily selects a path from among the paths in the set divided;
- setting, based on the information relating to the path-selecting gate, information relating to a combination of values that are possible to be a value of a control signal for controlling the path-selecting gate;
- judging whether the combination of values is possible based on the information relating to the combination;
- determining that the path extracted is a false path based on a judgment made at the judging; and
- outputting results of the determining.

10. A computer-readable recording medium that stores a computer program for detecting a timing exception path, the computer program making a computer execute:
- receiving circuit information relating to a circuit in which a timing exception path is to be detected;
- selecting, from among a plurality of sequential circuit elements in the circuit information, a first sequential circuit element and a second sequential circuit element that receives a signal transmitted from the first sequential circuit element;
- calculating value-capturing condition data relating to a multi-cycle in the second sequential circuit element;
- dividing, from among sets of paths between the first sequential circuit element and the second sequential circuit element, a set that matches the value-capturing condition data;
- detecting whether all of the paths in the set divided are multi-cycle paths; and
- outputting results of the detecting.

11. A computer-readable recording medium that stores a computer program for detecting a timing exception path, the computer program making a computer execute:
- receiving circuit information relating to a circuit in which a timing exception path is to be detected;
- selecting, from among a plurality of sequential circuit elements in the circuit information, a first sequential circuit element and a second sequential circuit element that receives a signal transmitted from the first sequential circuit element;
- calculating value-capturing condition data relating to a multi-cycle in the second sequential circuit element;
- dividing, from among sets of paths between the first sequential circuit element and the second sequential circuit element, a set that does not match the value-capturing condition data;
- detecting whether each of the paths in the set divided is a false path; and
- outputting results of the detecting.

12. A computer-readable recording medium that stores a computer program for detecting a timing exception path, the computer program making a computer execute:
- receiving circuit information relating to a circuit in which a timing exception path is to be detected;
- selecting, from among a plurality of sequential circuit elements in the circuit information, a first sequential circuit element and a second sequential circuit element that receives a signal transmitted from the first sequential circuit element;
- calculating value-capturing condition data relating to a multi-cycle in the second sequential circuit element;
- dividing, from among sets of paths between the first sequential circuit element and the second sequential circuit element, a set that does not match the value-capturing condition data;
- extracting information relating to a path-selecting gate that arbitrarily selects a path from among the paths in the set divided;
- setting, based on the information relating to the path-selecting gate, information relating to a combination of values that are possible to be a value of a control signal for controlling the path-selecting gate;
- judging whether the combination of values is possible based on the information relating to the combination;
- determining that the path extracted is a false path based on a judgment made at the judging; and
- outputting results of the determining.

* * * * *

UNITED STATES PATENT AND TRADEMARK OFFICE
CERTIFICATE OF CORRECTION

PATENT NO. : 7,299,437 B2  
APPLICATION NO. : 11/063773  
DATED : November 20, 2007  
INVENTOR(S) : Hiroyuki Higuchi Page 1 of 1

It is certified that error appears in the above-identified patent and that said Letters Patent is hereby corrected as shown below:

Column 14, Line 51, after "data;" insert --and--.

Signed and Sealed this

Sixth Day of May, 2008

JON W. DUDAS  
*Director of the United States Patent and Trademark Office*